United States Patent [19]

Gebhardt et al.

[11] Patent Number: 4,761,308

[45] Date of Patent: Aug. 2, 1988

[54] PROCESS FOR THE PREPARATION OF REFLECTIVE PYROLYTIC GRAPHITE

[75] Inventors: Joseph J. Gebhardt; Robert F. Mulvey, both of Malvern; John J. Yodsnukis, Philadelphia, all of Pa.

[73] Assignee: General Electric Company, Philadelphia, Pa.

[21] Appl. No.: 70,358

[22] Filed: Jun. 22, 1987

[51] Int. Cl.$^4$ .............................................. C23C 16/26
[52] U.S. Cl. .................... 427/249; 427/122; 427/255.1; 427/379
[58] Field of Search ............... 427/249, 122, 255.1, 427/379, 374.1

[56] References Cited

U.S. PATENT DOCUMENTS

| | | | |
|---|---|---|---|
| 2,922,722 | 1/1960 | Hutcheon | 427/249 |
| 3,084,394 | 4/1963 | Bickerdike et al. | 427/249 |
| 3,120,450 | 2/1964 | Diefendorf et al. | 427/249 |
| 3,138,435 | 6/1964 | Diefendorf | 427/249 |
| 3,172,774 | 3/1965 | Diefendorf | 427/249 |
| 3,317,338 | 2/1967 | Batchelor | 427/249 |
| 3,369,920 | 2/1968 | Bourdeau et al. | 427/249 |
| 3,379,555 | 4/1968 | Hough | 427/249 |
| 3,410,746 | 11/1968 | Turkat et al. | 427/249 |
| 3,429,020 | 2/1969 | Diefendorf | 427/249 |
| 3,533,825 | 10/1970 | Bohrer et al. | 427/249 |
| 3,547,676 | 12/1970 | Bokros et al. | 117/46 |
| 3,549,847 | 12/1970 | Clark et al. | 427/249 |
| 3,664,859 | 5/1972 | Beatty et al. | 427/249 |
| 3,666,526 | 5/1972 | Ettinger et al. | 427/249 |
| 3,715,253 | 2/1973 | Olcott | 427/249 |
| 3,720,499 | 3/1973 | Hirayama et al. | 427/249 |
| 3,725,110 | 4/1973 | Rodgers et al. | 427/249 |
| 3,900,540 | 8/1975 | Robba et al. | 264/29 |
| 4,194,027 | 3/1980 | Adams et al. | 427/249 |
| 4,241,104 | 12/1980 | Torbet | 427/249 |
| 4,472,454 | 9/1984 | Houdayer et al. | 427/249 |
| 4,492,652 | 1/1985 | Kaplan | 427/249 |
| 4,608,192 | 8/1986 | Su | 252/506 |

FOREIGN PATENT DOCUMENTS

| | | | |
|---|---|---|---|
| 1796145 | 2/1972 | Fed. Rep. of Germany | 427/249 |
| 6609343 | 1/1968 | Netherlands | 427/249 |

*Primary Examiner*—Sadie L. Childs
*Attorney, Agent, or Firm*—Allen E. Amgott

[57] ABSTRACT

A process for preparing reflective pyrolytic graphite by the chemical vapor deposition of graphite on a suitable support from methane or other short chain hydrocarbons at a suitable pressure and temperature followed by annealing the pyrolytic graphite at a temperature in excess of 2600° C. and pressure of 5 to 10 torr.

11 Claims, No Drawings

PROCESS FOR THE PREPARATION OF REFLECTIVE PYROLYTIC GRAPHITE

FIELD OF THE INVENTION

The invention relates to a process for the preparation of reflective pyrolytic graphite by the surface nucleation of pyrolytic graphite prepared by a chemical vapor deposition process using a low molecular weight hydrocarbon gas. The formed graphite is annealed at a temperature in excess of 2600° C.

BACKGROUND OF THE INVENTION

The invention relates to reflective graphite. The reflective graphite is prepared by preparing a surface nucleated pyrolytic graphite by a chemical vapor deposition technique. The chemical vapor deposition is carried out by the decomposition of low molecular weight hydrocarbon gases at a temperature of 1700°–2200° C. The pyrolytic graphite deposited is annealed at temperatures in excess of 2600° C. and pressures in excess of 5 torr.

U.S. Pat. No. 4,608,192 issued Aug. 28, 1986 describes a process for forming graphite intercalates containing metal charge transfer salts.

U.S. Pat. No. 3,900,540 issued Aug. 19, 1975 describes a method for preparing a thin film of substantially defect-free pyrolytic graphite by vapor deposition on an inert liquid substrate surface followed by separation of the graphite.

U.S. Pat. No. 3,547,676 issued Dec. 15, 1970 describes the preparation of pyrolytic carbon structures by chemical vapor deposition from a mixture of methane and inert gas at a temperature of about 2100° C.

There are several applications where reflective pyrolytic graphite is useful. Reflective graphite can be used for making high temperature reflectors in vacuum equipment and in high temperature heater insulation where the heater is used in inert atmospheres.

The prior art methods of preparing reflective graphite included deposition of metal inclusions in the graphite or deposition of a coating on the graphite to give the desired reflectivity to the product.

More generally it is an object of this invention to provide an improved process for the preparation of reflective graphite by pyrolysis of methane gas or other short chain hydrocarbons wherein the pyrolytic graphite formed on the substrate is annealed at a high temperature and pressure.

SUMMARY OF THE INVENTION

In accordance with the preferred embodiment of this invention pyrolytic graphite is deposited on a suitable support such as commercially available graphite designated CS graphite by the vendor, tungsten metal or hafnium metal. In the first step the substrate is positioned in a furnace and the furnace chamber is evacuated to a pressure in the order of 1 mm. When the pressure is reduced to about 1 mm the furnace is heated to about 700°–1000° C. preferably 900° C. at a rate of about 300° C. per hour.

When the temperature is reached it may be desirable to pass hydrogen gas through the furnace at a rate of about 15 standard cubic feet per hour. The heat up of the furnace is continued about a rate of about 300° C./hr until a temperature of about 1850°–2250° C. preferably 2150° C. is reached. When this temperature is reached the hydrogen flow, where hydrogen is used, is discontinued and methane is passing through the furnace at a flow of about of 30–40 standard cubic feet per hour preferably 36 standard cubic feet per hour. When the temperature and gas flow are stabilized at about 2150° C. and 36 standard cubic feet per hour the pressure in the furnace is increased to about 5 torr ±1.5 torr. These conditions are maintained until the deposit of pyrolytic graphite of a desired thickness is achieved. Thicknesses of about 0.2 to about 0.6 cm are preferred by most applications.

When the pyrolytic graphite deposit reaches the desired thickness the methane flow is discontinued and the furnace is cooled to atmospheric pressure and room temperature. Optionally nitrogen gas maybe passed through the furnace while it is being cooled.

The pyrolytic graphite is converted to reflective graphite by positioning the pyrolytic graphite on the support in a furnace and evacuating the furnace to a pressure of about 1 torr. The furnace temperature is increased to about 700 to about 1000° C. preferably about 900° C. at a rate of about 150° C. to 250° C. preferably about 200° C. per hour. When the desired temperature is reached the pressure is increased gradually to about 10 torr by feeding nitrogen gas into the furnace. The furnace temperature is increased to about 2600° C. to 3300° C. preferably about 2900°–2950° C. and these conditions maintained for about 10 minutes to 2 hours preferably about 1 hour. At the end of this time the furnace is cooled to room temperature and the reflective graphite product is recovered.

The process of the invention can also be used to impregnate reflective graphite onto a rigidized cloth or felt. The process is essentially the same except that after cloth or felt is positioned in the furnace and the furnace is evacuated to a pressure of 1 mm and the furnace is heated to a temperature of about 700° C. to 1000° C. preferably about 900° C. at a rate of about 300° C. per hour.

When the desired temperature is reached hydrogen gas is passed thru the furnace at a rate of about 15 standard cubic feet per hour.

When the furnace temperature reaches about 900° C. to 1200° C. preferably about 1100° C. methane or other short chain hydrocarbon gas is fed into the furnace at the rate of about 15 standard cubic feet per hour. When the temperature is stabilized at about 900°–1200° C. preferably about 1090°–1100° C. the pressure in the furnace is adjusted to 2 torr. These conditions are maintained for about 24 hours. At the end of this time the methane flow is discontinued and the furnace temperature is increased to 2100°–2150° C. at a rate of about 200° C. per hour.

When this temperature is reached the hydrogen flow is discontinued and methane is passed into the furnace at a rate of about 30–40 preferably 36 standard cubic feet per hour and the furnace pressure is adjusted to about 3.5 to 5 torr. These conditions are maintained until the thickness of the cloth of felt is increased to about 0.2 to 0.6 cm.

The cloth or felt impregnated with pyrolytic graphite is annealed using the same technique as described above.

The invention is illustrated by the following specific but non limiting examples

EXAMPLE I

This example illustrates the preparation of reflective pyrolytic graphite on a graphite support.

The substrate, a graphite designated CS graphite by the vendor, was positioned in a suitable furnace. The furnace chamber were evacuated to a pressure of about 1 mm and the temperature was increased at the rate about 300° C./hr until a temperature of 2150° C. was reached. When this temperature was reached methane gas was fed into the furnace at the rate of about 36 standard cubic feet per hour and the furnace pressure was increased to 4.8-5 torr. These conditions were maintained until the pyrolytic graphite was deposited to a thickness of 0.2-0.6 cm. When this thickness was reached the methane flow to the furnace was discontinued and nitrogen was fed into the furnace and the furnace was allowed to cool to room temperature.

The pyrolytic graphite was converted to reflective graphite. The furnace was evacuated to a pressure of about 1 torr and heated at the rate of 200° C. per hour until a temperature of 900° C. was reached. When the temperature reached 900° C. the pressure was increased to 5 torr and then gradually to about 10 torr by feeding nitrogen into the furnace. The heating was continued until the temperature reached 2900°-2950° C. and these conditions were maintained for a period of one hour. The furnace was allowed to cool to room temperature and atmospheric pressure and the reflective graphite part was recovered. The reflectance of the part was compared with the reflectance of a standard pyrolytic graphite. The data collected is set out in a table below. In this table the percentage of reflectance of the standard pyrolytic graphite and the reflecting pyrolytic graphite are compared and the percentage of advantage is set out.

| WAVE-LENGTH (microns) | REFLECTANCE COMPARISON REFLECTING PYROLYTIC GRAPHITE/ REGULAR PYROLYTIC GRAPHITE (PG) | | |
|---|---|---|---|
| | STANDARD PG | REFLECTING PG | % ADVANTAGE |
| 1.0 | .35 | .455 | 30 |
| 2.0 | .410 | .605 | 48 |
| 3.95 | .470 | .705 | 50 |
| 4.0 | .505 | .780 | 54 |
| 5.0 | .540 | 815 | 51 |
| 6.0 | .565 | .835 | 48 |
| 7.0 | .585 | .845 | 44 |
| 8.0 | .605 | .860 | 42 |
| 9.0 | .630 | .879 | 38 |
| 10.0 | .640 | .880 | 38 |
| 10.6 | .655 | .880 | 34 |
| 11.0 | .655 | .880 | 34 |

It is apparent from the data that there is a substantial advantage in the reflectance in the product prepared by the technique described above.

EXAMPLE II

This example illustrates preparing reflecting graphite on rigidized cloth or felt. A piece of felt was positioned in a furnace and the furnace was evacuated to a pressure to about 1 mm. When this pressure was reached the furnace was heated to approximately 900° C. at a rate of 300° C./hr. Hydrogen was fed to the furnace at the rate of about 15 standard cubic feet per hour and the heat up was continued until the temperature reached to 1100° C. When the temperature in the furnace reached 1100° C. methane was fed to the furnace at the rate of approximately 30 standard cubic feet per hour and the temperature was maintained at 1100° C. The methane flow, hydrogen flow, pressure and temperature were maintained for a period of 24 hours. After 24 hours the temperature was increased to 2150° C. and the hydrogen flow was discontinued. The methane flow was increased to 36 standard cubic feet per hour and the pressure was equalized at 5 torr. These conditions maintained until the deposit reached a thickness of about 0.2 to about 0.6 cm. The pyrolytic graphite was converted to reflective graphite using the same technique as described in example 1.

What is claimed is:

1. A process for preparing reflective graphite having improved reflectance which comprises the steps of (a) preparing pyrolytic graphite by depositing carbon by the chemical vapor deposition technique on a suitable support from a short chain hydrocarbon at a temperature of about 1850° C. to 2250° C. and a pressure of about 1 to 3 torr until the film is at least 1 mm thick and cooling, to room temperature, (b) positioning said support and pyrolytic graphite in a furnace, evacuating said furnace and slowly increasing the temperature of about 700°-1000° C. while maintaining a pressure of about 1 torr, (c) increasing the pressure in the furnace to 5 to 10 torr while increasing the temperature to about 2600° C. to 3300° C., (d) maintaining said temperature and pressure for about 10 minutes to 2 hours, and (e) cooling and recovering the reflective graphite product.

2. The process according to claim 1, wherein the support is selected from the group consisting of graphite, tungsten metal and hafnium metal.

3. The process according to claim 1, wherein the hydrocarbon is selected from the group consisting of methane, ethane, propane and natural gas.

4. The process according to claim 1 wherein the pyrolytic graphite film is about 0.1 to 0.6 cm in thickness.

5. The process according to claim 1 wherein the temperature is increased to about 900° C. at the rate of about 300° C. per hour in step (a) and about 200° C. per hour in step (b).

6. The process according to claim 1 wherein the temperature is increased to 2150° to 2160° C. in step (a).

7. The process according to claim 1 wherein the temperature is increased to about 2900° C. to 2950° C. in step (c).

8. The process according to claim 1 wherein the methane is fed to the furnace at a rate of about 36 standard cubic feet per hour in step (a).

9. The process according to claim 1 wherein the furnace is cooled in a nitrogen atmosphere in step (e).

10. A process for preparing reflective graphite having improved reflectance on a graphite, tungsten or hafnium substrate which comprises the steps of
    (a) positioning the said substrate in a furnace chamber,
    (b) evacuating the furnace chamber to a pressure of about 1 mm,
    (c) heating the furnace to about 2150° C. at a rate of about 300° C. per hour,
    (d) passing methane into said furnace chamber at a rate of about 36 standard cubic feet per hour and adjusting the pressure in said furnace chamber to about 4.8 to 5.2 torr, (e) maintaining the temperature at about 2150° C. to 2160° C., the methane flow at about 36 standard cubic feet per hour and the pressure at about 4.8 to 5.2 torr until pyrolytic graphite is deposited to a thickness of 0.1 to 0.6 centimeters, (f) discontinuing the methane flow and heating and passing nitrogen through the furnace until the temperature in the furnace is at room temperature and the pressure is at atmospheric, and recovering the substrate with the pyrolytic graphite deposited thereon, and (g) annealing said pyrolytic graphite structure by (a) evacuating said furnace to a pressure of about 1 torr, (b) heating the furnace chamber to about 900° C. at a rate of about 200° C. per hour, (c) increasing the pressure in said furnace chamber by passing nitrogen into the furnace until the pressure reaches about 5 to 10 torr, (d) maintaining the pressure at 5 to 10 torr while increasing the temperature to about 2850° to 2950° C. and maintaining the temperature for about 1 hour, and (e) cooling said furnace to room temperature and recovering the reflective graphite structure.

11. A process for impregnating rigidized fabric or felt with reflective graphite which comprises the steps of:

(a) positioning said fabric or felt in a furnace chamber and evacuating said chamber to a pressure of about 1 torr, (b) evacuating the furnace chamber to about 900° C. at a rate of about 300° C. per hour, (c) passing hydrogen into said furnace chamber at a rate of about 15 standard cubic feet per hour while heating said furnace chamber, (d) when the temperature in said furnace reaches about 1100° C. passing methane into said furnace at a rate of about 30 standard cubic feet per minute, and adjusting the pressure to 2 torr, (e) maintaining the methane flow at about 30 standard cubic feet per hour, the hydrogen flow at about 5 standard cubic feet per minute, the pressure at about 2 torr and the temperature at about 1100° to 1110° C. for a period of 24 hours, (f) after 24 hours discontinuning methane flow while maintaining hydrogen flow and increasing the furnace temperature to about 2150° C. at a rate of about 200° C. per hour, (g) after the temperature reaches about 2150° C. discontinuing hydrogen flow and passing methane into said furnace at a rate of about 36 standard cubic feet per minute, (h) adjusting the pressure in said furnace to about 4.8 to 5.2 torr and maintaining the temperature at about 2140° to 2160° C., the methane flow at about 36 standard cubic feet per hour until 0.1 to 0.6 centimeters of graphite is impregnated into said cloth or felt, and (i) discontinuing methane flow and heating and allowing said furnace chamber to cool to room temperature and recovering the pyrolytic graphite impregnated fabric or felt product, annealing said pyrolytic graphite impregnated fabric or felt by (a) evacuating said furnace to a pressure of about 1 torr, (b) heating said furnace chamber to about 900° C. at a rate of about 200° C. per hour, (c) increasing the pressure in said furnace to about 5 to 10 torr while continuing to heat said furnace to about 2900° to 2950° C., (d) maintaining the furnace temperature at about 2900° to 2950° C. and furnace pressure at about 5 to 10 torr for about 1 hour; and (e) allowing the furnace to cool to room temperature and atmospheric pressure and recovering the reflective graphite impregnated fabric or felt product.

* * * * *